United States Patent
Yeh et al.

(10) Patent No.: US 12,057,348 B2
(45) Date of Patent: Aug. 6, 2024

(54) METHOD FOR FABRICATING SEMICONDUCTOR DEVICE WITH PROTECTION LINER FOR BIT LINE

(71) Applicant: NANYA TECHNOLOGY CORPORATION, New Taipei (TW)

(72) Inventors: Huan-Yung Yeh, Taoyuan (TW); Chun-Chi Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 369 days.

(21) Appl. No.: 17/677,008

(22) Filed: Feb. 22, 2022

(65) Prior Publication Data
US 2023/0268226 A1    Aug. 24, 2023

(51) Int. Cl.
| | |
|---|---|
| H01L 21/768 | (2006.01) |
| H01L 21/28 | (2006.01) |
| H01L 21/3213 | (2006.01) |
| H01L 29/40 | (2006.01) |
| H10B 12/00 | (2023.01) |

(52) U.S. Cl.
CPC .. *H01L 21/76843* (2013.01); *H01L 21/28079* (2013.01); *H01L 21/32135* (2013.01); *H01L 29/401* (2013.01); *H10B 12/482* (2023.02)

(58) Field of Classification Search
CPC ...... H10B 12/34; H10B 12/48; H10B 12/482; H10B 12/485; H10B 12/488; H01L 21/7684; H01L 21/76877; H01L 21/743
See application file for complete search history.

(56) References Cited

U.S. PATENT DOCUMENTS

| | | |
|---|---|---|
| 8,877,580 B1 | 11/2014 | Chen et al. |
| 2010/0044785 A1 | 2/2010 | Murphy et al. |
| 2010/0090348 A1 | 4/2010 | Park et al. |
| 2019/0393320 A1 | 12/2019 | Yoo et al. |
| 2021/0335792 A1* | 10/2021 | Su .......................... H10B 12/34 |

OTHER PUBLICATIONS

Office Action and Search Report mailed on Mar. 21, 2023 related to Taiwanese Application No. 111117715.

* cited by examiner

*Primary Examiner* — Thanhha S Pham
(74) *Attorney, Agent, or Firm* — Xuan Zhang

(57) ABSTRACT

A method for fabricating a semiconductor device includes forming a trench extending from a top surface of a semiconductor substrate into the semiconductor substrate, and forming a gate dielectric layer lining the trench. The method also includes forming a gate electrode layer in the trench and over the top surface of the semiconductor substrate, and forming a bit line structure over a S/D region of the semiconductor structure. The bit line structure includes a protection liner having a U-shaped profile and in direct contact with an upper portion of the gate dielectric layer. The formation of the gate electrode layer includes performing a first deposition process, performing a first etching process after the first deposition process, and performing a second deposition process after the first etching process.

20 Claims, 20 Drawing Sheets

METHOD FOR FABRICATING SEMICONDUCTOR DEVICE WITH PROTECTION LINER FOR BIT LINE

TECHNICAL FIELD

The present disclosure relates to a method for fabricating a semiconductor device, and more particularly, to a method for fabricating a semiconductor device with a protection liner for bit line.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as overhang and/or void formed in conductive structure, which results from the difficulties in filling a high aspect ratio trench. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes performing a first deposition process, performing a first etching process after the first deposition process, and performing a second deposition process after the first etching process. The method also includes forming a bit line structure over a S/D region of the semiconductor structure, wherein the bit line structure includes a protection liner having a U-shaped profile and in direct contact with an upper portion of the gate dielectric layer.

In an embodiment, a gate electrode material is deposited over the gate dielectric layer and the top surface of the semiconductor substrate during the first deposition process, and a gap is surrounded by the gate electrode material. In an embodiment, the gap is widened during the first etching process. In an embodiment, the gate electrode material has a thickness over the top surface of the semiconductor substrate before the first etching process, and the thickness of the gate electrode material is reduced during the first etching process. In an embodiment, the formation of the gate electrode layer further includes performing a second etching process after the second deposition process, wherein the first etching process and the second etching process are dry etching processes, and performing a third deposition process after the second etching process. In an embodiment, the method further includes etching the gate electrode layer to form a recess over a remaining portion of the gate electrode layer such that a top surface of the remaining portion of the gate electrode layer is lower than the top surface of the semiconductor substrate, and forming a dielectric cap layer to cover the remaining portion of the gate electrode layer and the top surface of the semiconductor substrate. In an embodiment, the method further includes removing a portion of the dielectric capping layer to expose a source/drain (S/D) region adjacent to the remaining portion of the gate electrode layer, and forming a bit line structure over the S/D region.

In another embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes depositing a first gate electrode material over the gate dielectric layer and the top surface of the semiconductor substrate, and a first gap is surrounded by the first gate electrode material. The formation of the gate electrode layer also includes etching the first gate electrode material to widen the first gap such that a first opening is surrounded by a remaining portion of the first gate electrode material, and a top width of the first opening is greater than a top width of the first gap. The method also includes forming a bit line structure over a S/D region of the semiconductor structure, wherein the bit line structure includes a protection liner having a U-shaped profile and in direct contact with an upper portion of the gate dielectric layer.

In an embodiment, the method further includes forming a barrier layer over the gate dielectric layer before the gate electrode layer is formed, recessing the gate electrode layer and the barrier layer to form a gate structure, and forming a dielectric cap layer over the gate structure. In an embodiment, the formation of the gate electrode layer further includes depositing a second gate electrode material over the remaining portion of the first gate electrode material. In an embodiment, a second gap is surrounded by the second gate electrode material. In an embodiment, a first distance between a bottommost surface of the first gap and the top surface of the semiconductor substrate is greater than a second distance between a bottommost surface of the second gap and the top surface of the semiconductor substrate. In an embodiment, the formation of the gate electrode layer further includes etching the second gate electrode material to widen the second gap such that a second opening is surrounded by a remaining portion of the second gate electrode material, wherein a top width of the second opening is greater than a top width of the second gap. In an embodiment, the formation of the gate electrode layer further includes depositing a third gate electrode material over the remaining portion of the second gate electrode material, wherein the first gate electrode material, the second gate electrode material and the third gate electrode material are made of tungsten.

In yet another embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes depositing a first gate electrode material over the gate dielectric layer and the top surface of the semiconductor substrate, and a first gap is surrounded by the first gate electrode material. The formation of the gate electrode layer also includes etching the first gate electrode material to reduce a thickness of the first gate electrode material over the top surface of the semiconductor substrate, and depositing a second gate electrode material over a remaining portion of the first gate electrode material after the first gate electrode material is etched. The method also includes forming a bit line structure over a S/D region of the semiconductor structure, wherein the bit line structure includes a protection liner having a U-shaped profile and in direct contact with an upper portion of the gate dielectric layer.

In an embodiment, the first gap is enlarged during the etching of the first gate electrode material such that a first opening is surrounded by the remaining portion of the first gate electrode material before the second gate electrode material is deposited, and a top width of the first opening is greater than a top width of the first gap. In an embodiment, the formation of the gate electrode layer further includes etching the second gate electrode material to reduce a thickness of the second gate electrode material over the top surface of the semiconductor substrate. In an embodiment, a second gap surrounded by the second gate electrode material is enlarged during the etching of the second gate electrode material such that a second opening is surrounded by a remaining portion of the second gate electrode material. In an embodiment, the first gate electrode material and the second gate electrode material include tungsten, and an etchant used to etch the first gate electrode material includes $N_2$. In an embodiment, the method further includes etching the gate electrode layer to form a recess in the trench, and forming a dielectric cap layer in the recess and over the top surface of the semiconductor substrate such that a portion of the dielectric cap layer is surrounded by the gate dielectric layer.

Embodiments of a method for fabricating a semiconductor device are provided in the disclosure. The method includes forming a gate electrode layer over a semiconductor substrate, and a trench in the semiconductor substrate is filled by the gate electrode layer. The formation of the gate electrode layer includes sequentially performing a first deposition process, a first etching process, and a second deposition process. By performing a first etching process between the first deposition process and the second deposition process, the formation of defects (e.g., overhangs or voids) inside the gate electrode layer can be prevented. Moreover, the thickness of the gate electrode layer over the semiconductor substrate can be reduced by performing the first etching process, which results in a lowering of stress. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
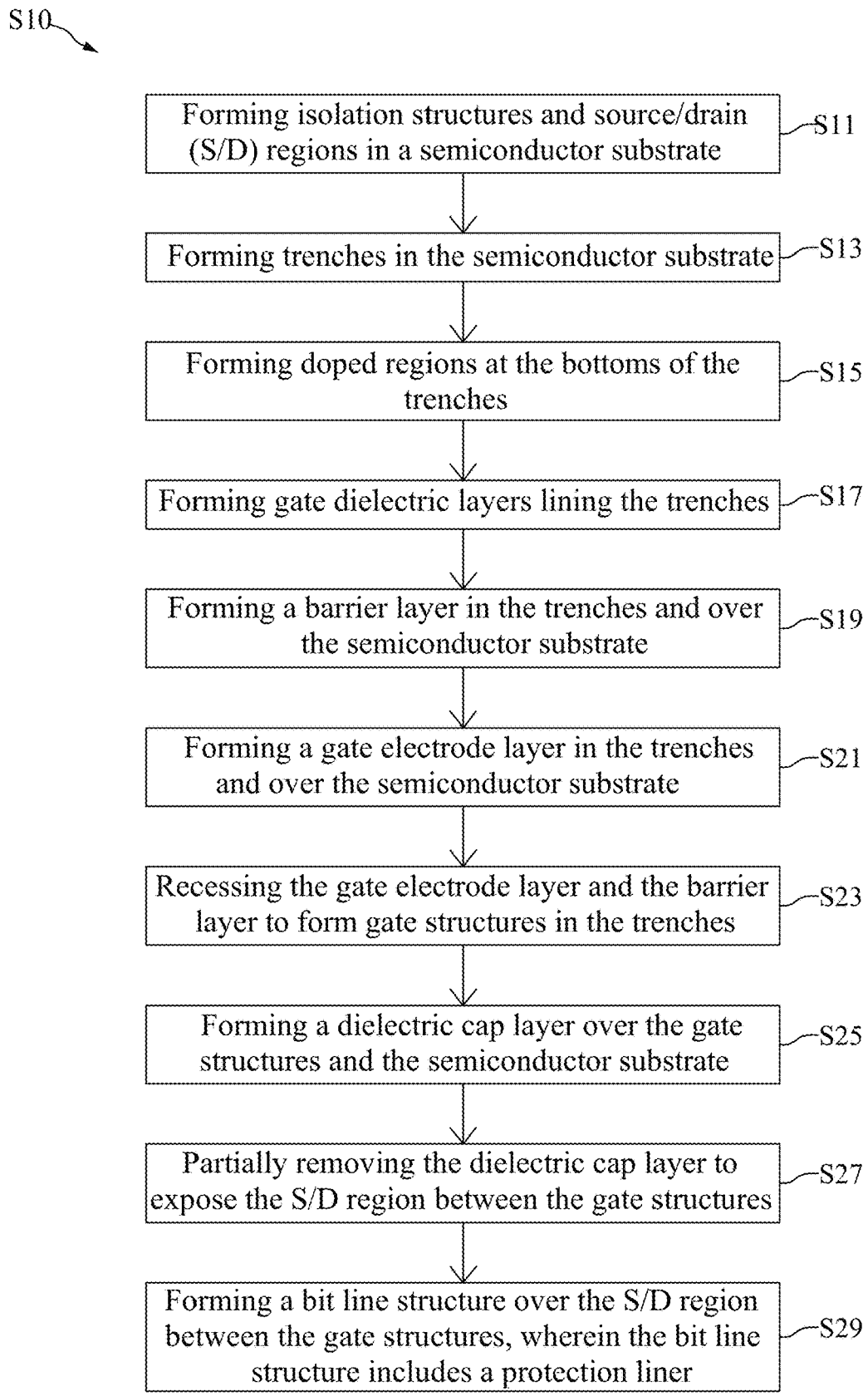
FIG. 1 is a flow diagram illustrating a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
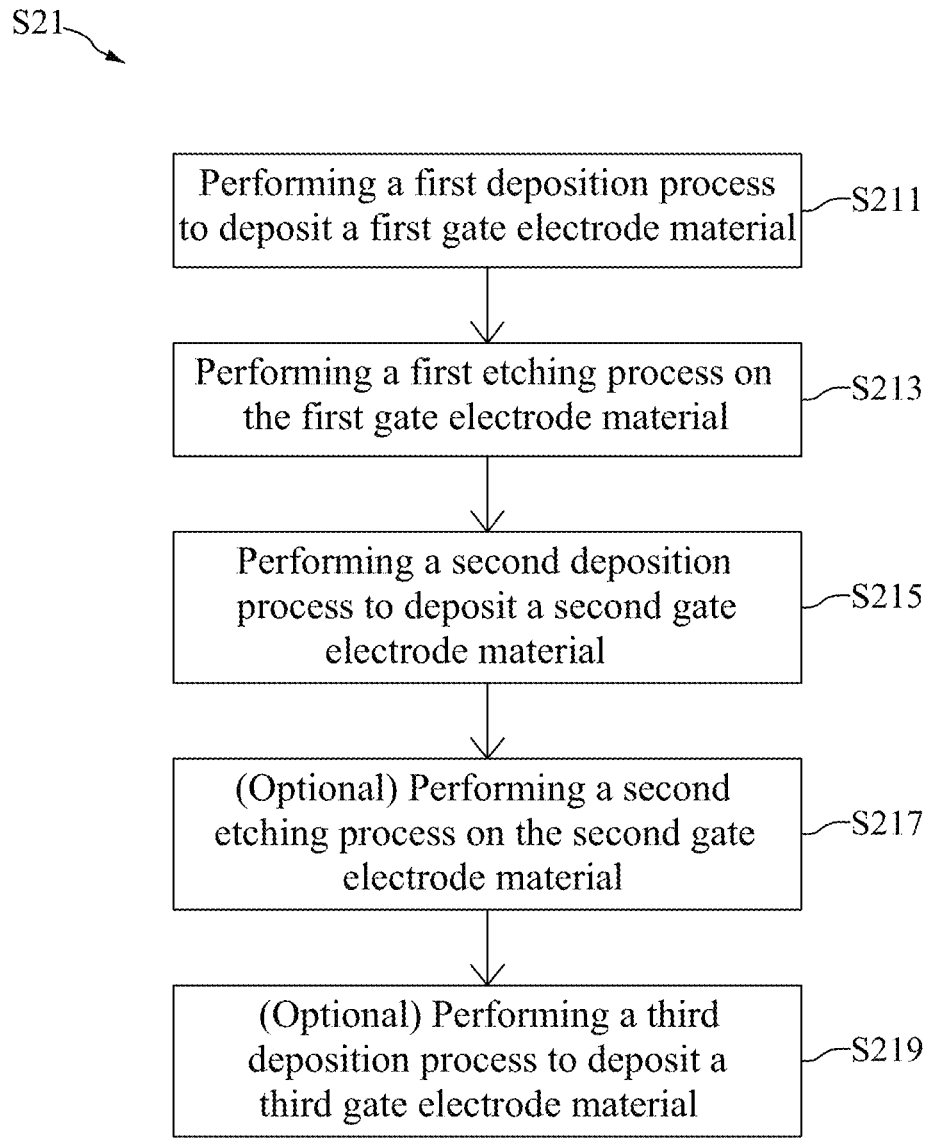
FIG. 2 is a flow diagram illustrating an intermediate stage of forming a gate electrode layer during the formation of the semiconductor device, in accordance with some embodiments.

FIG. 1 is a flow diagram illustrating a method 10 for forming a semiconductor device 100, and the method 10 includes steps S11, S13, S15, S17, S19, S21, S23, S25, S27, and S29, in accordance with some embodiments. FIG. 2 is a flow diagram illustrating multiple sub-steps of step S21 in the method 10 of FIG. 1, and the step S21 includes sub-steps S211, S213, S215, S217, and S219, in accordance with some embodiments.

The steps S11 to S29 of FIG. 1 and the sub-steps S211 to S219 of FIG. 2 are first introduced briefly and then elaborated in connection with the following figures. As shown in FIG. 1, the method 10 begins at step S11 where isolation structures and source/drain (S/D) regions are formed in a semiconductor substrate. In some embodiments, the isolation structures are formed prior to the S/D regions. At step S13, trenches are formed in the semiconductor substrate. In some embodiments, the trenches are formed extending form a top surface of the semiconductor substrate into the semiconductor substrate.

At step S15, doped regions are formed at the bottoms of the trenches. In some embodiments, the doped regions are formed by an ion implantation process. At step S17, gate dielectric layers are formed lining the trenches. In some embodiments, the gate dielectric layers do not extend over the top surface of the semiconductor substrate. At step S19, a barrier layer is formed in the trenches and over the semiconductor substrate. In some embodiments, the gate dielectric layers and the top surface of the semiconductor substrate are covered by the barrier layer. At step S21, a gate electrode layer is formed in the trenches and over the semiconductor substrate. In some embodiments, the formation of the gate electrode layer includes multiple sub-steps, which will be described in detail later along with FIG. 2.

At step S23, the gate electrode layer and the barrier layer are recessed to form gate structures in the trenches. In some embodiments, recesses are formed over the gate structures such that the top surfaces of the gate structures are located at a lower level than the top surface of the semiconductor substrate. At step S25, a dielectric cap layer is formed over the gate structures and the semiconductor substrate. In some embodiments, portions of the dielectric cap layer extending into the recesses are surrounded by the gate dielectric layers. At step S27, the dielectric cap layer is partially removed to expose the S/D region between the gate structures. In some embodiments, a bit line opening is formed penetrating through the dielectric cap layer.

At step S29, a bit line structure is formed over the S/D region between the gate structures. In some embodiments, a lower bit line layer is formed in the bit line opening and covering the dielectric cap layer, an upper bit line layer is formed over the lower bit line layer, and the lower bit line layer and the upper bit line layer are patterned to form the bit line structure. After the bit line structure is formed, the semiconductor device 100 is obtained. In some embodiments, the semiconductor device 100 is a dynamic random access memory (DRAM), and the gate electrodes are buried word lines (WL).

As shown in FIG. 2, the step S21 begins at sub-step S211 where a first deposition process is performed to deposit a first gate electrode material. In some embodiments, the first gate electrode material is conformally deposited in the trenches and extending over the top surface of the semiconductor substrate. In addition, first gaps are surrounded by the first gate electrode material. At sub-step S213, a first etching process is performed on the first gate electrode material. In some embodiments, the first gaps are widened (or enlarged) by the first etching process, and the widened (or enlarged) first gaps are defined as first openings. The first openings are surrounded by the remaining portion of the first gate electrode material. Moreover, a thickness of the first gate electrode material over the top surface of the semiconductor substrate is reduced during the first etching process.

At sub-step S215, a second deposition process is performed to deposit a second gate electrode material. In some embodiments, the second gate electrode material is conformally deposited in the first openings and extending over the top surface of the semiconductor substrate. In addition, second gaps surrounded by the second gate electrode material may be formed. If the second gaps are not formed, or are shallow enough to avoid significant defect formation (e.g., overhang and/or void) in the resulting gate electrode layer, the step S21 can be completed after the sub-step S215 and the method 10 (FIG. 1) can proceed directly to the step S23. In these cases, the resulting gate electrode layer is composed of the remaining portion of the first gate electrode material and the second gate electrode material.

If the second gaps are deep enough to cause undesired defect formation, the step S21 can proceed to the sub-step S217, where a second etching process is performed on the second gate electrode material. Similar to the first etching process, the second etching process widen (or enlarge) the second gaps, and the widened (or enlarged) second openings are defined as second openings. The second openings are surrounded by the remaining portion of the second gate electrode material. Moreover, a thickness of the second gate electrode material over the top surface of the semiconductor substrate may be reduced during the second etching process.

At sub-step S219, a third deposition process is performed to deposit a third gate electrode material. In some embodiments, the third gate electrode material is conformally deposited in the second opening and extending over the top surface of the semiconductor substrate, and then, the method 10 (FIG. 1) can proceed to the step S23. In these cases, the resulting gate electrode layer is composed of the remaining portion of the first gate electrode material, the remaining portion of the second gate electrode material, and the third gate electrode material.

In some embodiments, third gaps surrounded by the third gate electrode material are formed, and the third gaps are deep enough to cause defect formation (e.g., overhang and/or void), an etching process and a subsequent deposition process, which are similar to the second etching process and the third deposition process may be repeatedly performed after the sub-step S219 and before the step S23 of FIG. 1.

FIGS. 3-19 are cross-sectional views illustrating various stages of forming the semiconductor device 100 by the method 10 of FIG. 1 and the multiple sub-steps of FIG. 2 in accordance with some embodiments of the present disclosure.

Figure 3:
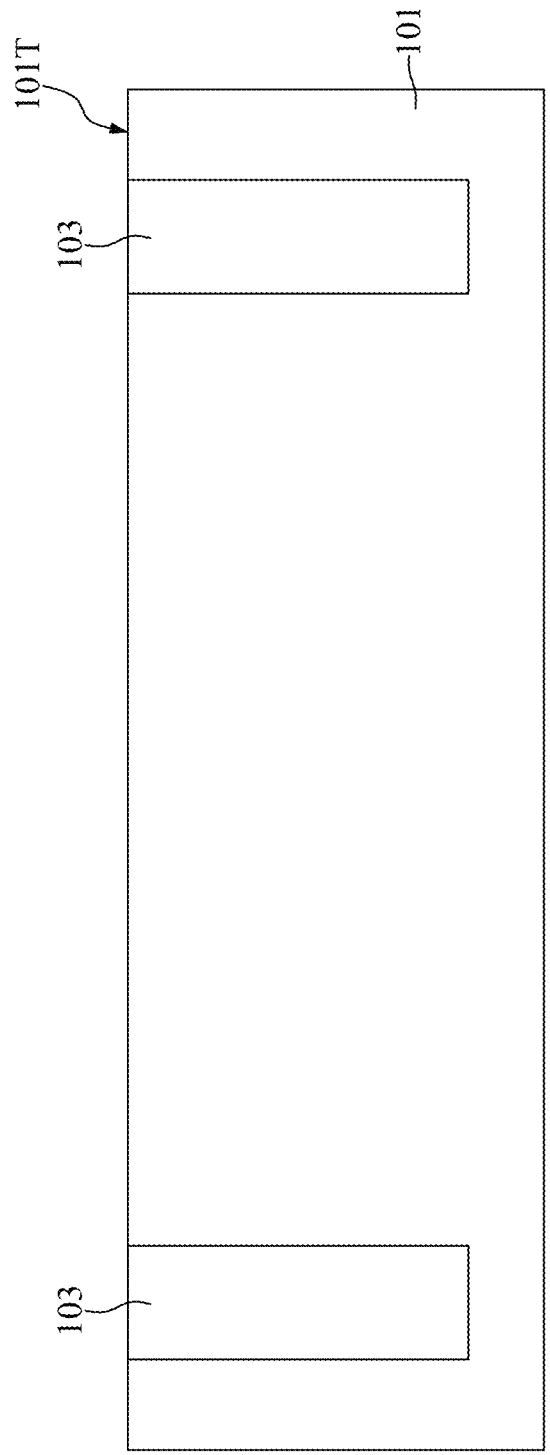
FIG. 3 is a cross-sectional view illustrating an intermediate stage of forming isolation structures in a semiconductor substrate during the formation of the semiconductor device, in accordance with some embodiments.

As shown in FIG. 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

Still referring to FIG. 3, isolation structures 103 are formed in the semiconductor substrate 101 to define active areas, and the isolation structures 103 are shallow trench isolation (STI) structures, in accordance with some embodiments. In some embodiments, the isolation structures 103 extend from a top surface 101T of the semiconductor substrate 101 into the semiconductor substrate 101. In addition, the isolation structures 103 may be made of silicon oxide, silicon nitride, silicon oxynitride or another applicable dielectric material, and the formation of the isolation structures 103 may include forming a patterned mask (not shown) over the top surface 101T of the semiconductor substrate 101, etching the semiconductor substrate 101 to form openings (not shown) by using the patterned mask as a mask, depositing a dielectric material in the openings and over the semiconductor substrate 101, and polishing the dielectric material until the top surface 101T of the semiconductor substrate 101 is exposed.

Figure 4:
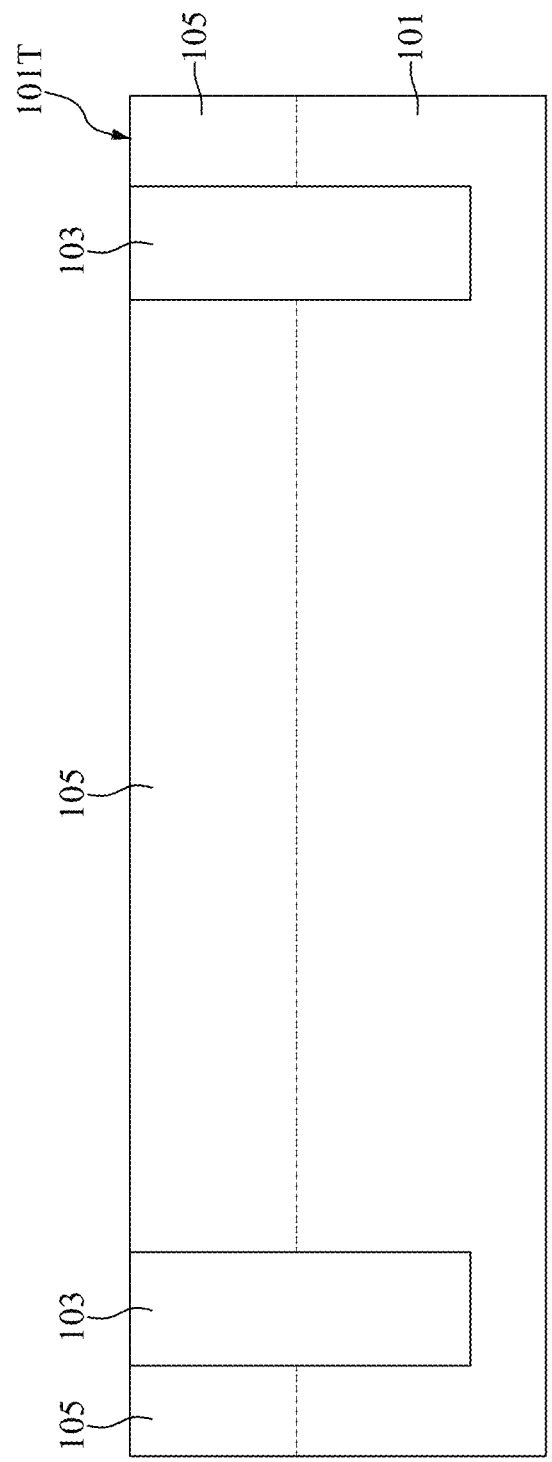
FIG. 4 is a cross-sectional view illustrating an intermediate stage of forming source/drain (S/D) regions in the semiconductor substrate during the formation of the semiconductor device, in accordance with some embodiments.

Next, source/drain (S/D) regions 105 are formed in the semiconductor substrate 101, as shown in FIG. 4 in accordance with some embodiments. The respective step is illustrated as the step S11 in the method 10 shown in FIG. 1. In some embodiments, the S/D regions 105 are formed by one or more ion implantation processes, and P-type dopants, such as boron (B), gallium (Ga), or indium (In), or N-type dopants, such as phosphorous (P) or arsenic (As), can be implanted in the active areas to form the S/D regions 105, depending on design requirements of the semiconductor device 100.

Figure 5:
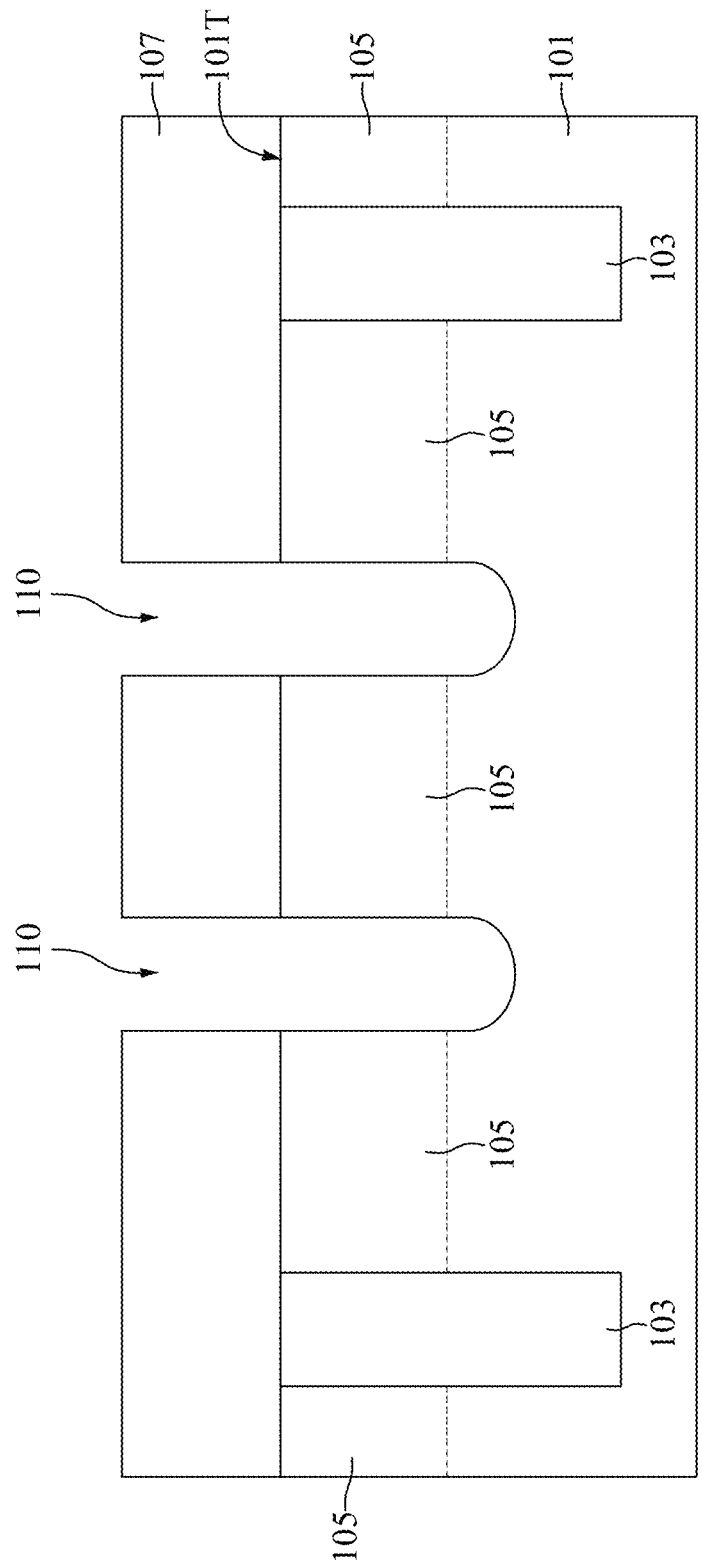
FIG. 5 is a cross-sectional view illustrating an intermediate stage of forming trenches in the semiconductor substrate during the formation of the semiconductor device, in accordance with some embodiments.

After the S/D regions 105 are formed, a patterned mask 107 is formed over the top surface 101T of the semiconductor substrate 101, and trenches 110 are formed in the semiconductor substrate 101 by performing an etching process using the patterned mask 107 as a mask, as shown in FIG. 5 in accordance with some embodiments. The respective step is illustrated as the step S13 in the method 10 shown in FIG. 1.

The patterned mask 107 may be formed by a deposition process and a patterning process. The deposition process for forming the patterned mask 107 may be a chemical vapor deposition (CVD) process, a high-density plasma CVD (HDPCVD) process, a spin-coating process, or another applicable process. The patterning process for forming the patterned mask 107 may include a photolithography process and an etching process. The photolithography process may include photoresist coating (e.g., spin-coating), soft baking, mask aligning, exposure, post-exposure baking, developing the photoresist, rinsing and drying (e.g., hard baking), and the etching process may include a dry etching process, a wet etching process, or a combination thereof.

In some embodiments, the etching process for forming the trenches 110 includes a dry etching process, a wet etching process, or a combination thereof. In some embodiments, the trenches 110 extend downward from the top surface 101T of the semiconductor substrate 101 into the semiconductor substrate 101. In particular, the trenches 110 penetrate through the S/D regions 105 and even extend at a lower level than the bottom surfaces of the S/D regions 105.

Figure 6:
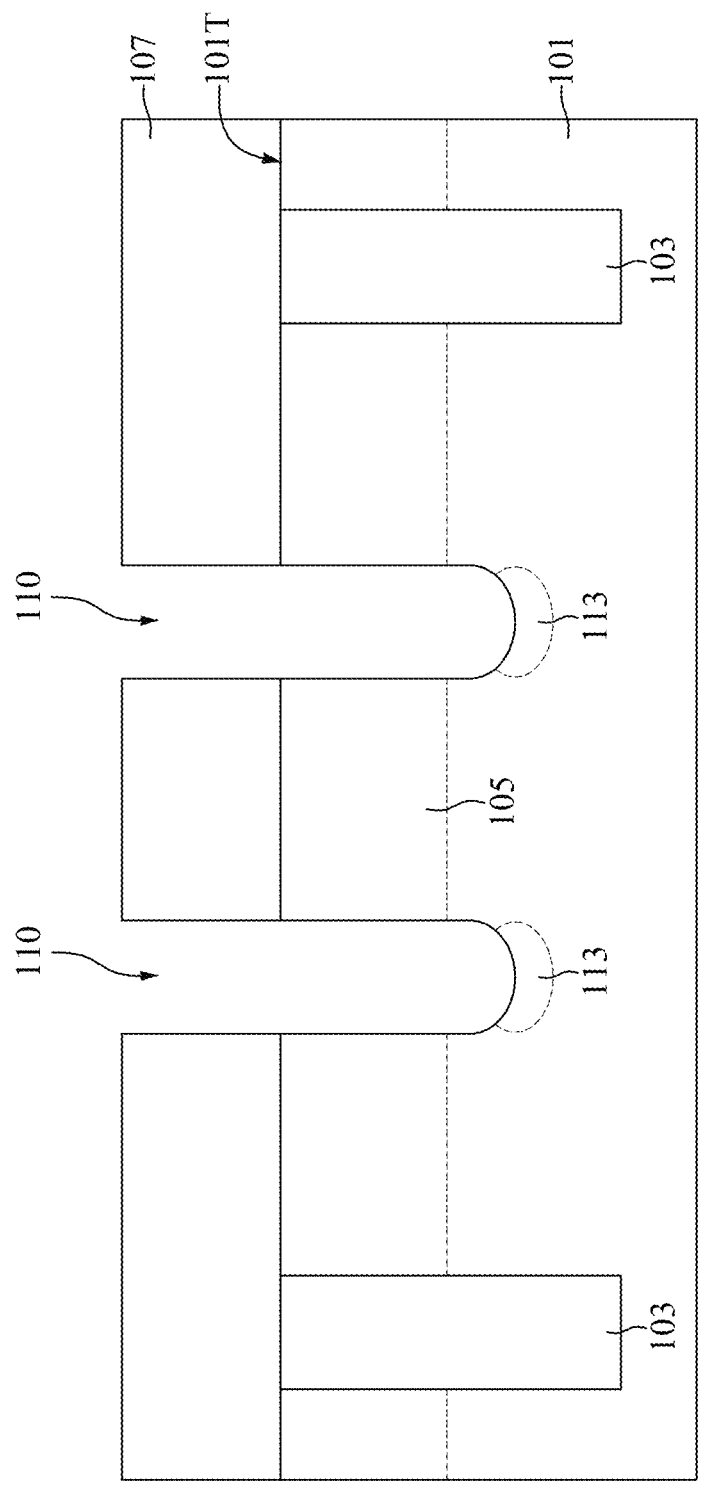
FIG. 6 is a cross-sectional view illustrating an intermediate stage of forming doped regions at the bottoms of the trenches during the formation of the semiconductor device, in accordance with some embodiments.

Subsequently, doped regions 113 are formed at the bottoms of the trenches 110, as shown in FIG. 6 in accordance with some embodiments. The respective step is illustrated as the step S15 in the method 10 shown in FIG. 1. In some embodiments, the doped regions 113 are formed by performing one or more ion implantation processes using the patterned mask 107 as a mask.

The dopants of the ion implantation processes may include fluorine-based ions. In some embodiments, boron fluoride ions, such as $BF_3^+$ and $BF_2^{2+}$, are doped into the semiconductor substrate 101 through the trenches 110. The energy and the concentration of the ion implantation process are configured to increase a threshold voltage of a channel, and the energy and the concentration of the ion implantation process can be adjusted depending on the operation conditions and the operation characteristics of the channel After the doped regions 113 are formed, the patterned mask 107 may be removed.

Figure 7:
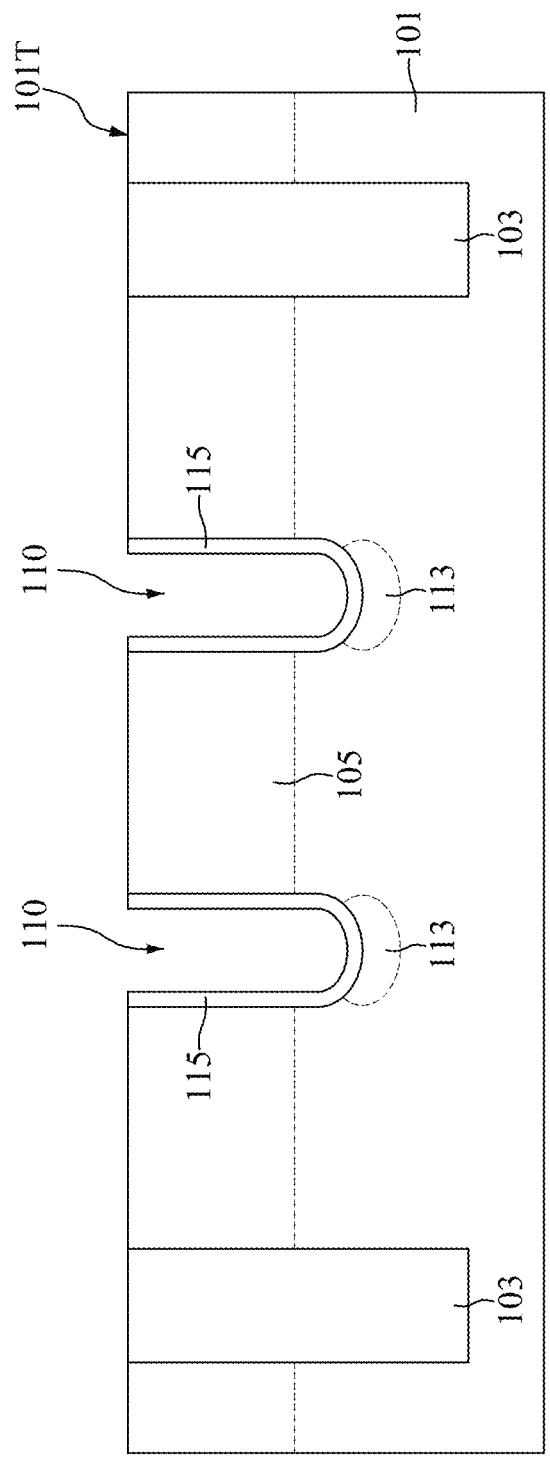
FIG. 7 is a cross-sectional view illustrating an intermediate stage of forming gate dielectric layers lining the trenches during the formation of the semiconductor device, in accordance with some embodiments.

Then, gate dielectric layers 115 are formed lining the trenches 110, as shown in FIG. 7 in accordance with some embodiments. The respective step is illustrated as the step S17 in the method 10 shown in FIG. 1. Specifically, the inner sidewalls and the bottom surfaces of the trenches 110 are conformally covered by the gate dielectric layers 115. In some embodiments, the gate dielectric layers 115 are made of silicon oxide, silicon nitride, silicon oxynitride, a dielectric material with high dielectric constant (high-k), or a combination thereof. In some embodiments, the gate dielectric layers 115 are formed by a thermal oxidation process, a CVD process, a physical vapor deposition (PVD) process, an atomic layer deposition (ALD) process, another applicable process, or a combination thereof.

Figure 8:
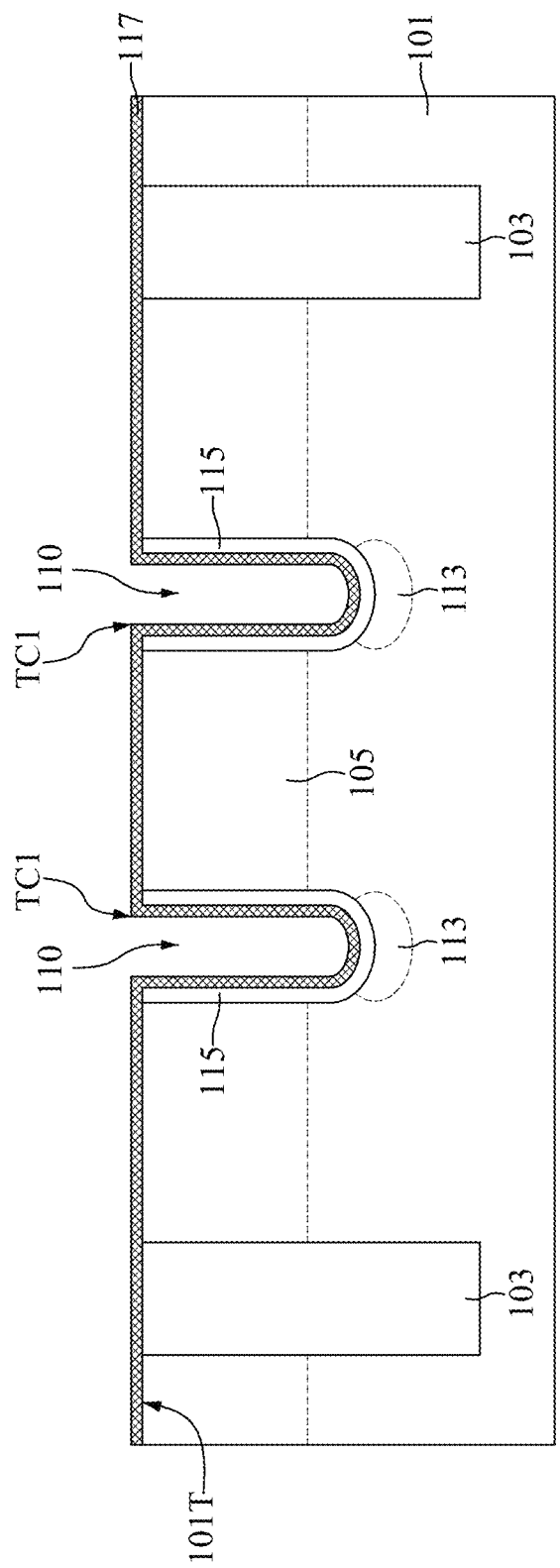
FIG. 8 is a cross-sectional view illustrating an intermediate stage of forming a barrier layer during the formation of the semiconductor device, in accordance with some embodiments.

Next, a barrier layer 117 is formed in the trenches 110 and over the semiconductor substrate 101, as shown in FIG. 8 in accordance with some embodiments. The respective step is illustrated as the step S19 in the method 10 shown in FIG. 1. Specifically, the top surface 101T of the semiconductor substrate 101 and the gate dielectric layers 115 in the trenches 110 are conformally covered by the barrier layer 117.

In some embodiments, the barrier layer 117 is made of titanium nitride (TiN), and the barrier layer 117 is formed by a CVD process, a PVD process, an ALD process, a metal organic CVD (MOCVD) process, a sputtering process, a plating process, a sputtering process or another applicable process. In some other embodiments, the barrier layer 117 is made of tantalum (Ta), tantalum nitride (TaN), titanium (Ti), cobalt tungsten (CoW), another applicable material, or a combination thereof.

Figure 9:
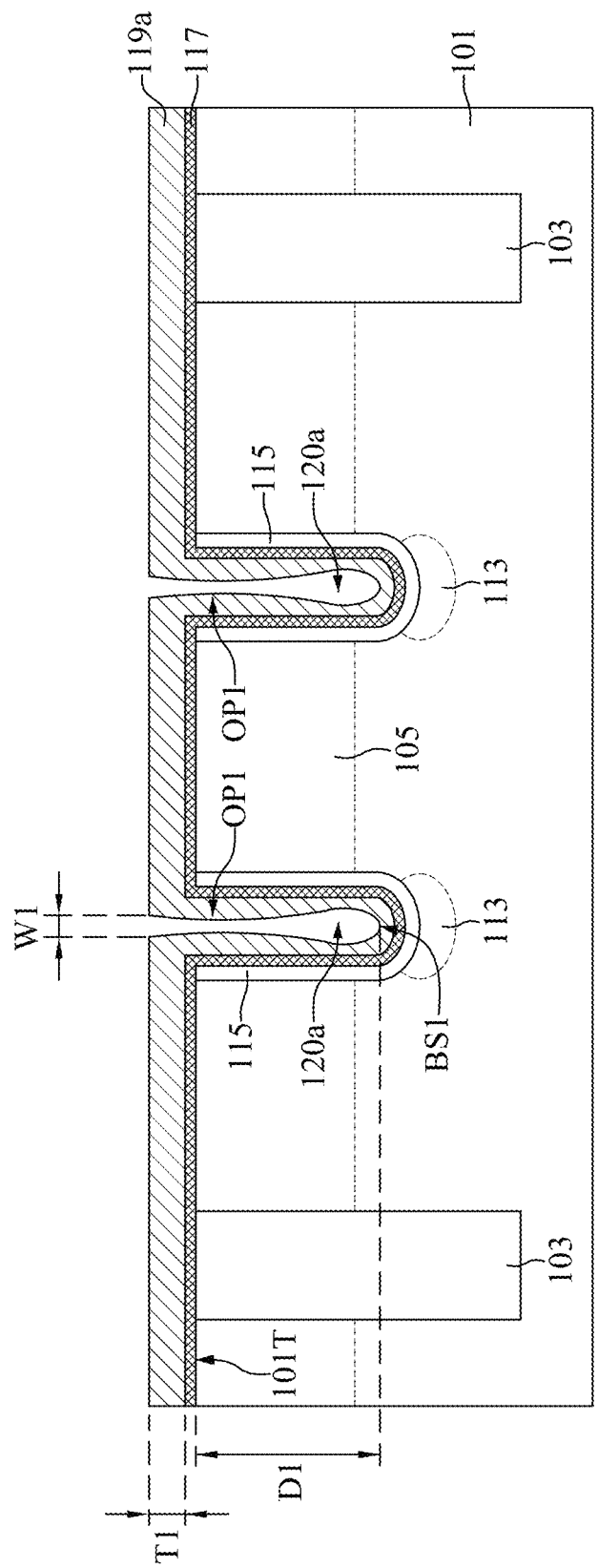
FIG. 9 is a cross-sectional view illustrating an intermediate stage of forming a first gate electrode material during the formation of the semiconductor device, in accordance with some embodiments.

After the barrier layer 117 is formed, a gate electrode layer 119 is formed in the trenches 110 and over the semiconductor substrate 101, as shown in FIGS. 9-13 in accordance with some embodiments. The respective step is illustrated as the step S21 in the method 10 shown in FIG. 1. As shown in FIG. 9, the formation of the gate electrode layer 119 begins at the sub-step S211 where a first deposition process is performed to conformally deposit a first gate electrode material 119a in the trenches 110 (FIG. 8) and extending over the top surface 101T of the semiconductor substrate 101, in accordance with some embodiments. More specifically, the first gate electrode material 119a covers the barrier layer 117, and first gaps 120a are surrounded by the first gate electrode material 119a.

In some embodiments, the first gate electrode material 119a has overhang portions OP1 close to the top corners TC1 (FIG. 8) of the barrier layer 117. The overhang portions OP1 may result from the difficulties in filling high aspect ratio trenches, such as the trenches 110 (FIG. 8). In some embodiments, the first deposition process should be stopped before the first gaps 120a are closed (or sealed) (i.e., the overhang portions OP1 of the same trench 110 are physically connected). In some embodiments, the first gate electrode material 119a is made of tungsten (W). In some other embodiments, the first gate electrode material 119a is made of poly-crystalline silicon, aluminum (Al), copper (Cu), nickel (Ni), cobalt (Co), another conductive material, or a combination thereof. Moreover, the first gate electrode material 119a is formed by a CVD process, in accordance with some embodiments.

In some embodiments, the first deposition process utilizes precursors such as tungsten fluoride ($WF_6$) and hydrogen ($H_2$), although any suitable precursors can be utilized. In an exemplary embodiment using tungsten fluoride and hydrogen as the precursors, the chemical vapor deposition process may be performed at a temperature of between about 300° C. and about 400° C., and at a pressure which is about 40 torr. However, any suitable process conditions may be utilized.

Figure 10:
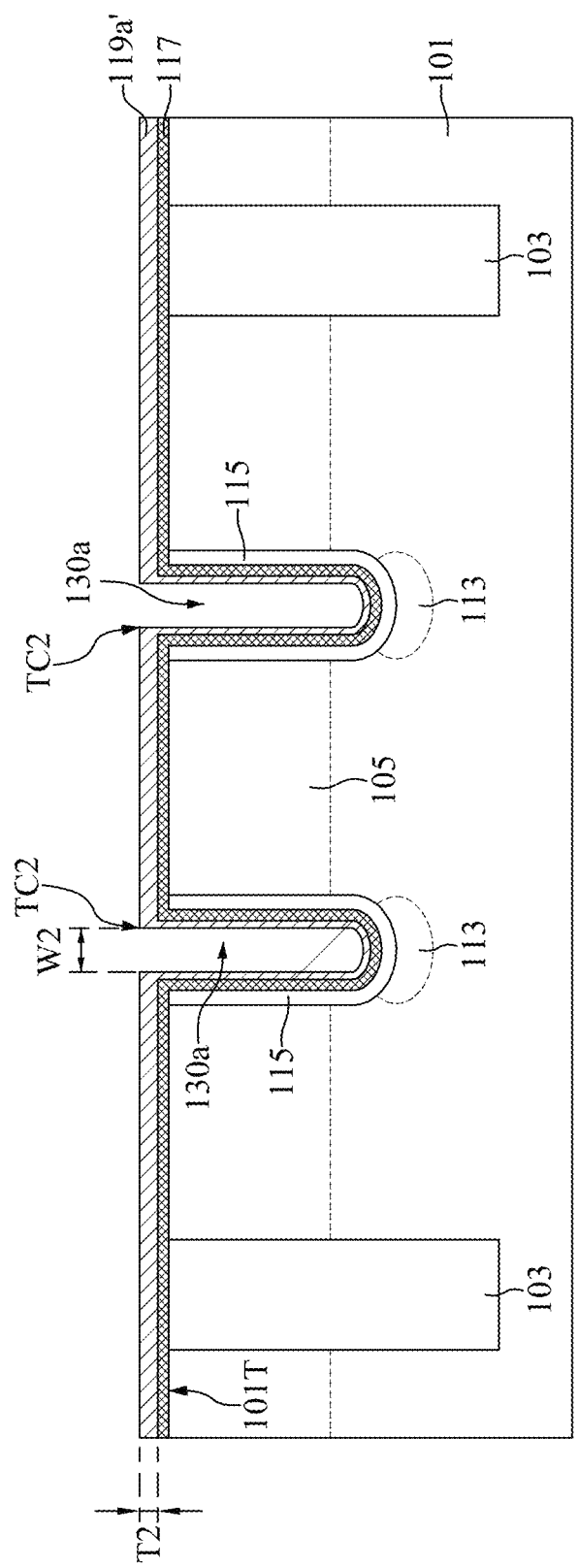
FIG. 10 is a cross-sectional view illustrating an intermediate stage of etching the first gate electrode material during the formation of the semiconductor device, in accordance with some embodiments.

After the first deposition process is performed, the formation of the gate electrode layer 119 proceeds to the sub-step S213 where a first etching process is performed on the first gate electrode material 119a, as shown in FIG. 10 in accordance with some embodiments. It should be noted that the overhang portions OP1 are etched such that the first gaps 120a are widened (or enlarged), and the widened (or enlarged) first gaps 120a are defined as first openings 130a. The first openings 130a are surrounded by the remaining portion of the first gate electrode material 119a'.

In some embodiments, the first etching process is a dry etching process. For example, the first etching process includes using a nitrogen-based etchant gas, such as $N_2$, and the gas flow is about 40 sccm. In an exemplary embodiment, the first etching process may be implemented with an applied bias voltage which is about 50 W, and the duration is about 20 seconds.

Referring to FIGS. 9 and 10, each of the first gaps 120a has a top width W1, and each of the first openings 130a has a top width W2. In some embodiments, the top width W2 is greater than the top width W1. Moreover, before the first etching process, the first gate electrode material 119a has a thickness T1 over the top surface 101T of the semiconductor substrate 101. After the first etching process, the remaining portion of the first gate electrode material 119a' has a thickness T2 over the top surface 101T of the semiconductor substrate 101. In some embodiments, the thickness T1 is greater than the thickness T2. As a result, the accumulated stress over the top surface 101T of the semiconductor substrate 101 may be reduced by performing the first etching process.

Figure 11:
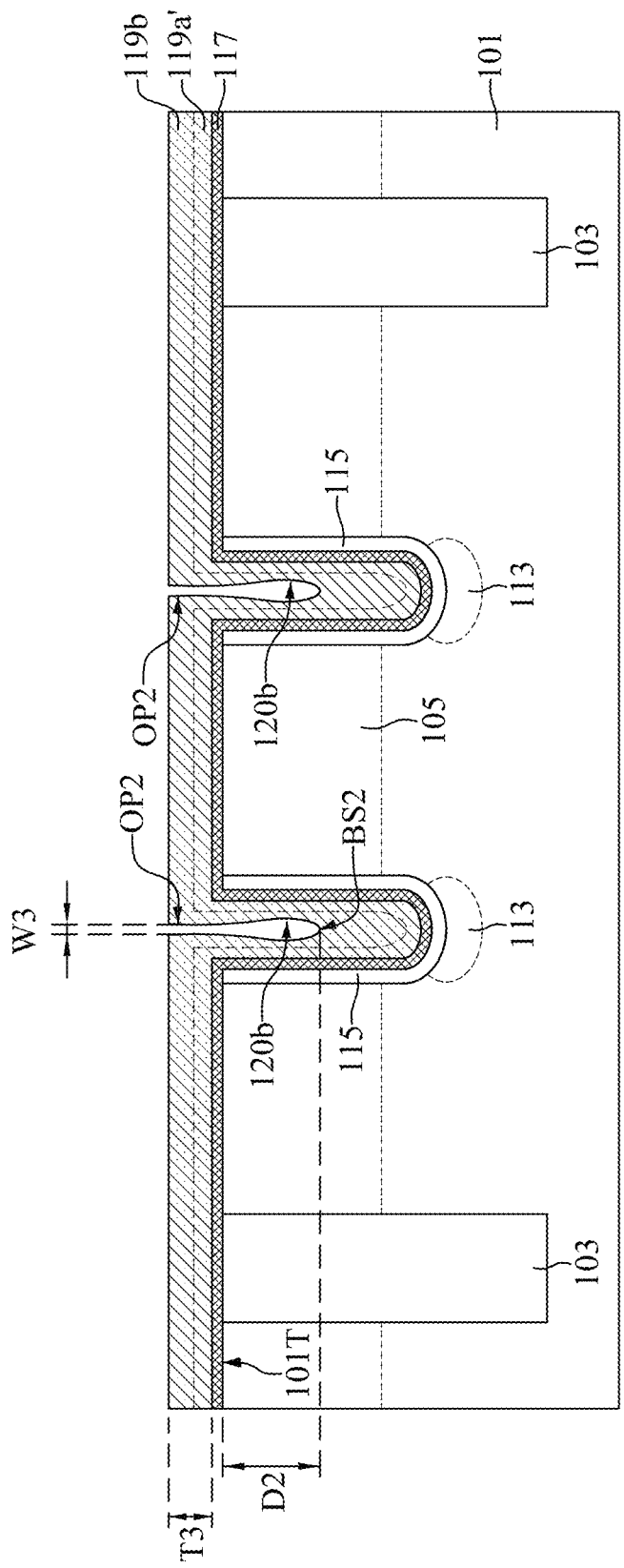
FIG. 11 is a cross-sectional view illustrating an intermediate stage of forming a second gate electrode material during the formation of the semiconductor device, in accordance with some embodiments.

Subsequently, the formation of the gate electrode layer 119 proceeds to the sub-step S215 where a second deposition process is performed to conformally deposit a second gate electrode material 119b in the first openings 130a (FIG. 10) and extending over the top surface 101T of the semiconductor substrate 101, as shown in FIG. 11 in accordance with some embodiments. More specifically, the second gate electrode material 119b covers the remaining portion of the first gate electrode material 119a', and second gaps 120b are surrounded by the second gate electrode material 119b.

In some embodiments, the second gate electrode material 119b has overhang portions OP2 close to the top corners TC2 (FIG. 10) of the remaining portion of the first gate electrode material 119a'. Similar to the overhang portions OP1, the overhang portions OP2 may result from the difficulties in filling high aspect ratio openings, such as the first openings 130a (FIG. 10). In some embodiments, the second deposition process should be stopped before the second gaps 120b are closed (or sealed) (i.e., the overhang portions OP2 of the same opening are physically connected).

Some materials and processes used to form the second gate electrode material 119b are similar to, or the same as, those used to form the first gate electrode material 119a, and details thereof are not repeated herein. In some embodiments, the first gate electrode material 119a and the second gate electrode material 119b are made of the same material (i.e., tungsten) and are formed by the same process using the same precursors, such as the chemical vapor deposition process using tungsten fluoride ($WF_6$) and hydrogen ($H_2$) as the precursors.

Referring to FIGS. 9 and 11, a first distance D1 is defined between the bottommost surface BS1 of the first gaps 120a and the top surface 101T of the semiconductor substrate 101, and a second distance D2 is defined between the bottommost surface BS2 of the second gaps 120b and the top surface 101T of the semiconductor substrate 101. In some embodiments, the first distance D1 is greater than the second distance D2. In other words, the bottommost surface BS1 of the first gaps 120a may be located at a lower level than the bottommost surface B S2 of the second gaps 120b.

Figure 12:
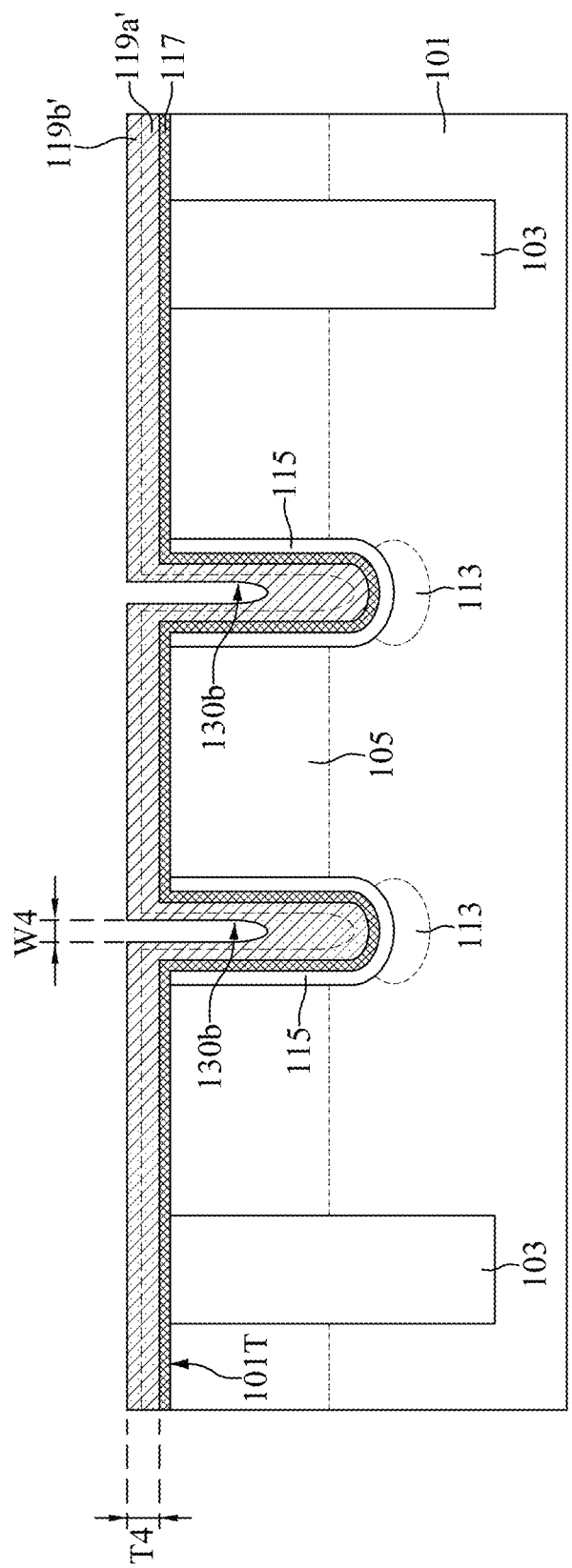
FIG. 12 is a cross-sectional view illustrating an intermediate stage of etching the second gate electrode material during the formation of the semiconductor device, in accordance with some embodiments.
Figure 13:
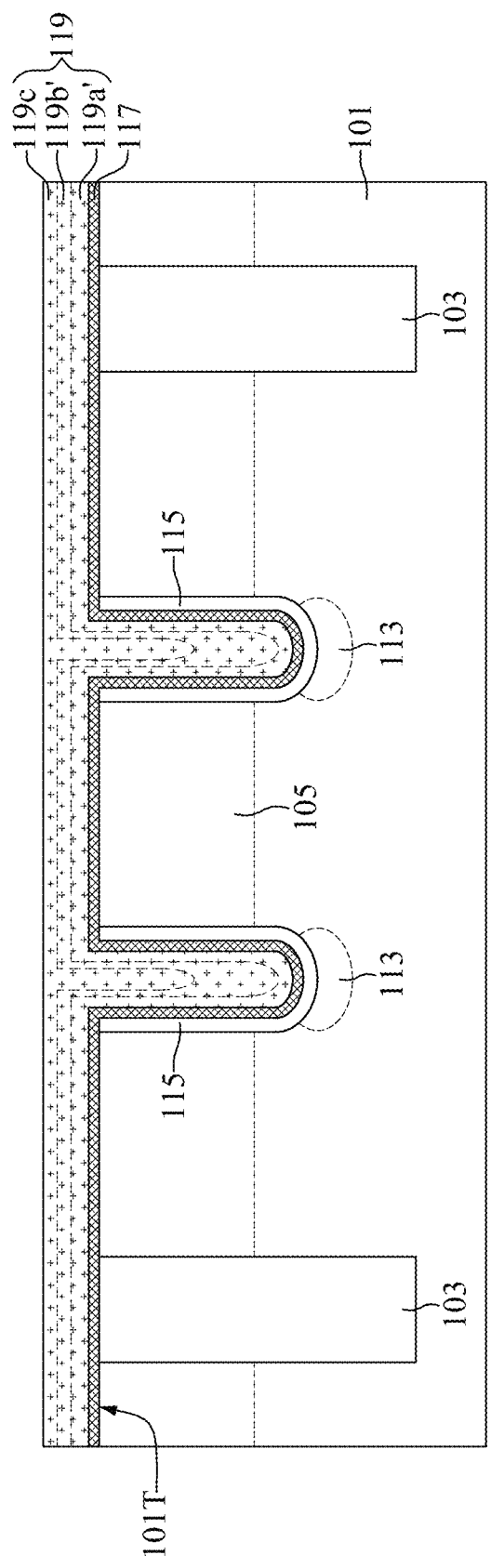
FIG. 13 is a cross-sectional view illustrating an intermediate stage of forming a third gate electrode material during the formation of the semiconductor device, in accordance with some embodiments.
Figure 14:
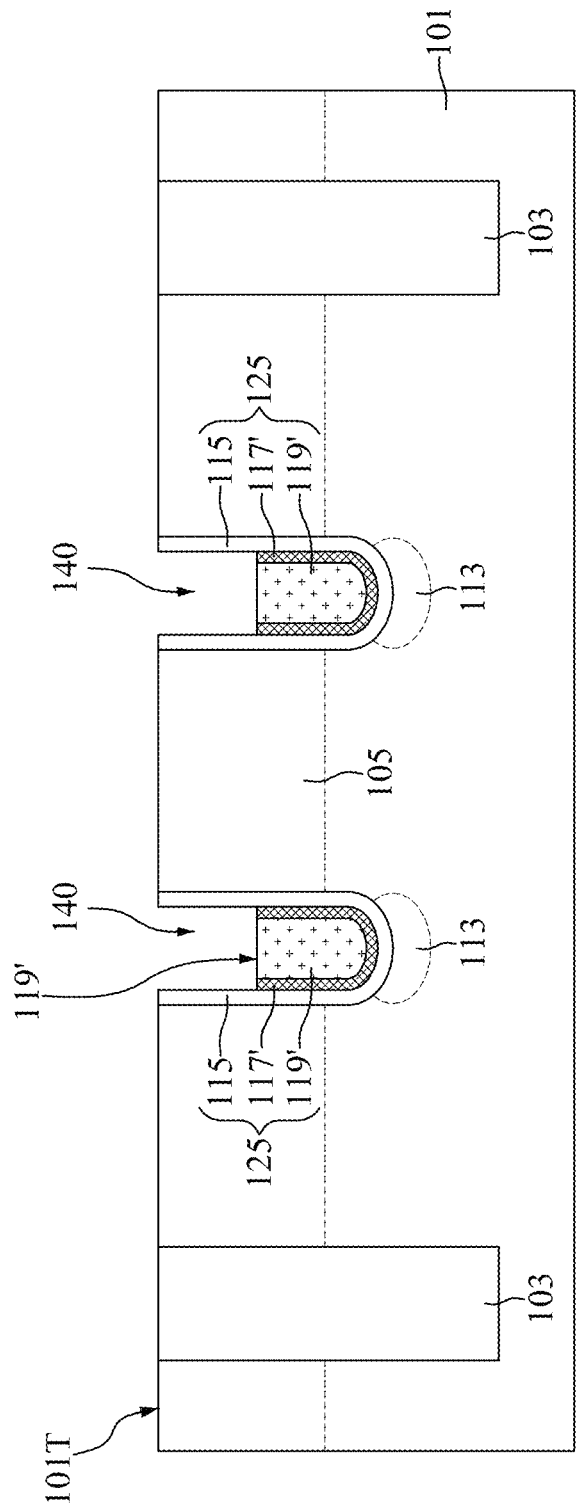
FIG. 14 is a cross-sectional view illustrating an intermediate stage of forming a gate structure buried in the semiconductor substrate during the formation of the semiconductor device, in accordance with some embodiments.

As mentioned above, if the second gaps 120b are not formed, or are shallow enough to avoid significant defect formation (e.g., overhang and/or void) in the resulting gate electrode layer, the method for fabricating the semiconductor device 100 can proceed directly to FIG. 14, which means that FIGS. 11 and 12 can be skipped and FIG. 13 is the structure after the second deposition process is performed. In these cases, the resulting gate electrode layer (i.e., the gate electrode layer 119 of FIG. 13) is composed of the remaining portion of the first gate electrode material 119a' and the second gate electrode material 119b.

If the second gaps 120b are deep enough to cause undesired defect formation, the formation of the gate electrode layer 119 proceeds to the sub-step S217 where a second etching process is performed on the second gate electrode material 119b, as shown in FIG. 12 in accordance with some embodiments. It should be noted that the overhang portions OP2 are etched such that the second gaps 120b are widened (or enlarged), and the widened (or enlarged) second gaps 120b are defined as second openings 130b. The second openings 130b are surrounded by the remaining portion of the second gate electrode material 119b'.

In some embodiments, the second etching process is a dry etching process. For example, the second etching process includes using a nitrogen-based etchant gas, such as $N_2$, and the gas flow is about 40 sccm. In an exemplary embodiment, the second etching process may be implemented with an applied bias voltage which is about 50 W, and the duration is about 20 seconds.

Referring to FIGS. 11 and 12, each of the second gaps 120b has a top width W3, and each of the second openings 130b has a top width W4. In some embodiments, the top width W4 is greater than the top width W3. Moreover, before the second etching process, the second gate electrode material 119b has a thickness T3 over the top surface 101T of the semiconductor substrate 101. After the second etching process, the remaining portion of the second gate electrode material 119b' has a thickness T4 over the top surface 101T of the semiconductor substrate 101. In some embodiments, the thickness T3 is greater than the thickness T4. As a result, the accumulated stress over the top surface 101T of the semiconductor substrate 101 may be reduced by performing the second etching process. Moreover, in some embodiments, the top width W4 is less than the top width W2.

Subsequently, the formation of the gate electrode layer 119 proceeds to the sub-step S219 where a third deposition process is performed to deposit a third gate electrode material 119c in the second openings 130b (FIG. 12) and extending over the top surface 101T of the semiconductor substrate 101, as shown in FIG. 13 in accordance with some embodiments. More specifically, the third gate electrode material 119c covers the remaining portion of the second gate electrode material 119b'.

Some materials and processes used to form the third gate electrode material 119c are similar to, or the same as, those used to form the first gate electrode material 119a, and details thereof are not repeated herein. In some embodiments, the first gate electrode material 119a, the second gate electrode material 119b, and the third gate electrode material 119c are made of the same material (i.e., tungsten) and are formed by the same process using the same precursors, such as the chemical vapor deposition process using tungsten fluoride ($WF_6$) and hydrogen ($H_2$) as the precursors.

After the third deposition process is performed, the gate electrode layer 119 is obtained, and the gate electrode layer 119 is composed of the remaining portion of the first gate electrode material 119a', the remaining portion of the second gate electrode material 119b', and the third gate electrode material 119c, as shown in FIG. 13 in accordance with some embodiments. As mentioned above, an etching process and a subsequent deposition process, which are similar to the second etching process and the third deposition process may be repeatedly performed is needed.

Next, the gate electrode layer 119 and the barrier layer 117 are recessed to form gate structures 125, as shown in FIG. 14 in accordance with some embodiments. The respective step is illustrated as the step S23 in the method 10 shown in FIG. 1. In some embodiments, the gate electrode layer 119 and the barrier layer 117 are recessed through an etch-back process, and the gate structures 125 include the gate dielectric layer 115, the etched barrier layer 117', and the etched gate electrode layer 119'. In addition, recesses 140 are obtained over the gate structures 125, such that the top surface 119'T of the etched gate electrode layer 119' is located at a lower level than the top surface 101T of the semiconductor substrate 101, in accordance with some embodiments.

Figure 15:
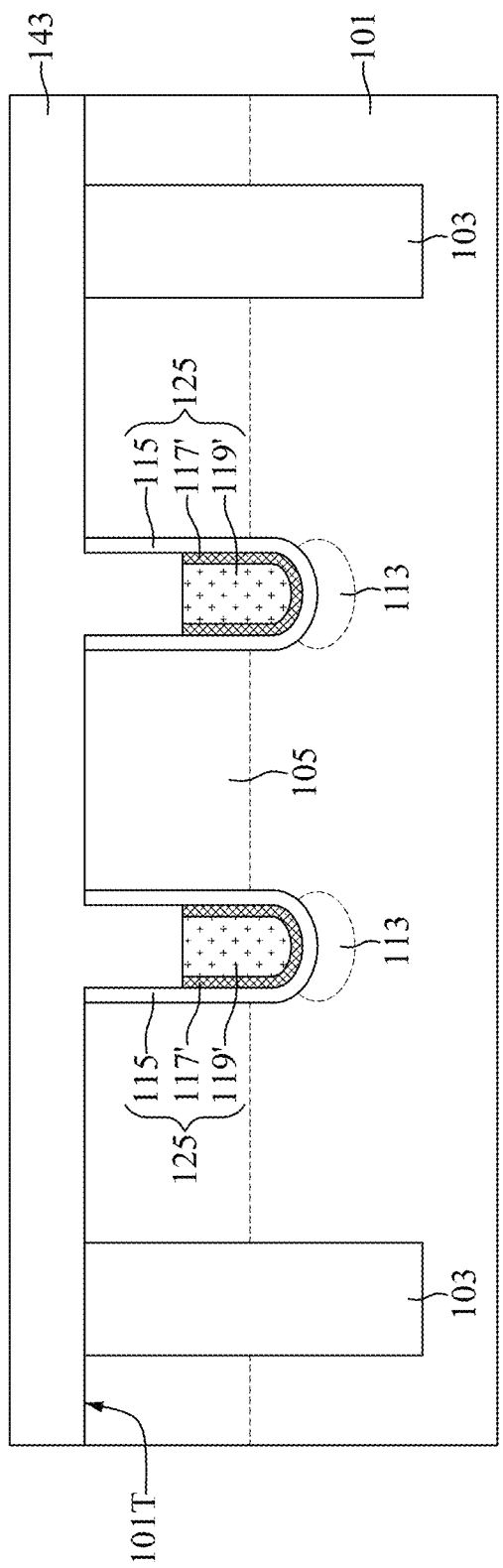
FIG. 15 is a cross-sectional view illustrating an intermediate stage of forming a dielectric cap layer over the gate structure during the formation of the semiconductor device, in accordance with some embodiments.

Subsequently, a dielectric cap layer 143 is formed over the gate structures 125 and extending over the top surface 101T of the semiconductor substrate 101, as shown in FIG. 15 in accordance with some embodiments. The respective step is illustrated as the step S25 in the method 10 shown in FIG. 1. In some embodiments, the dielectric cap layer 143 is made of silicon oxide, silicon nitride, silicon oxynitride, or another applicable dielectric material, and the dielectric cap layer 143 is formed by a CVD process, a PVD process, a spin coating process, another applicable process, or a combination thereof.

Figure 16:
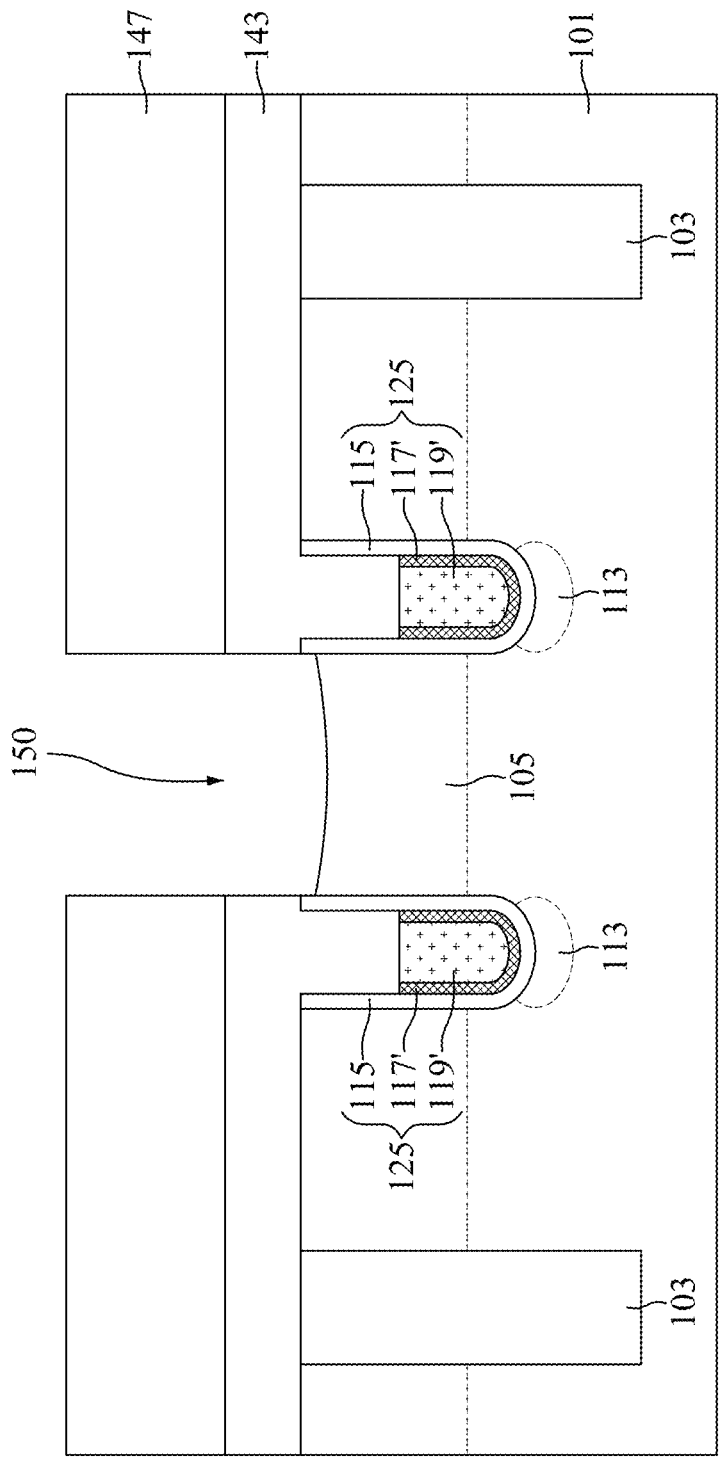
FIG. 16 is a cross-sectional view illustrating an intermediate stage of forming an opening in the dielectric cap layer during the formation of the semiconductor device, in accordance with some embodiments.

After the dielectric cap layer 143 is formed, a patterned mask 147 is formed over the dielectric cap layer 143, and the dielectric cap layer 143 is partially removed to expose the S/D region 105 between the gate structures 125 by performing an etching process using the patterned mask 147 as a mask, as shown in FIG. 16 in accordance with some embodiments. The respective step is illustrated as the step S27 in the method 10 shown in FIG. 1. In some embodiments, the S/D region 105 between the gate structures 125 is exposed by an opening 150 penetrating through the dielectric cap layer 143.

Some processes used to form the patterned mask 147 are similar to, or the same as, those used to form the patterned mask 107 of FIG. 5, and details thereof are not repeated herein. The etching process for forming the opening 150 may include a dry etching process, a wet etching process, or a combination thereof. After the opening 150 (i.e., bit line opening 150) is formed, the patterned mask 147 may be removed.

Figure 17:
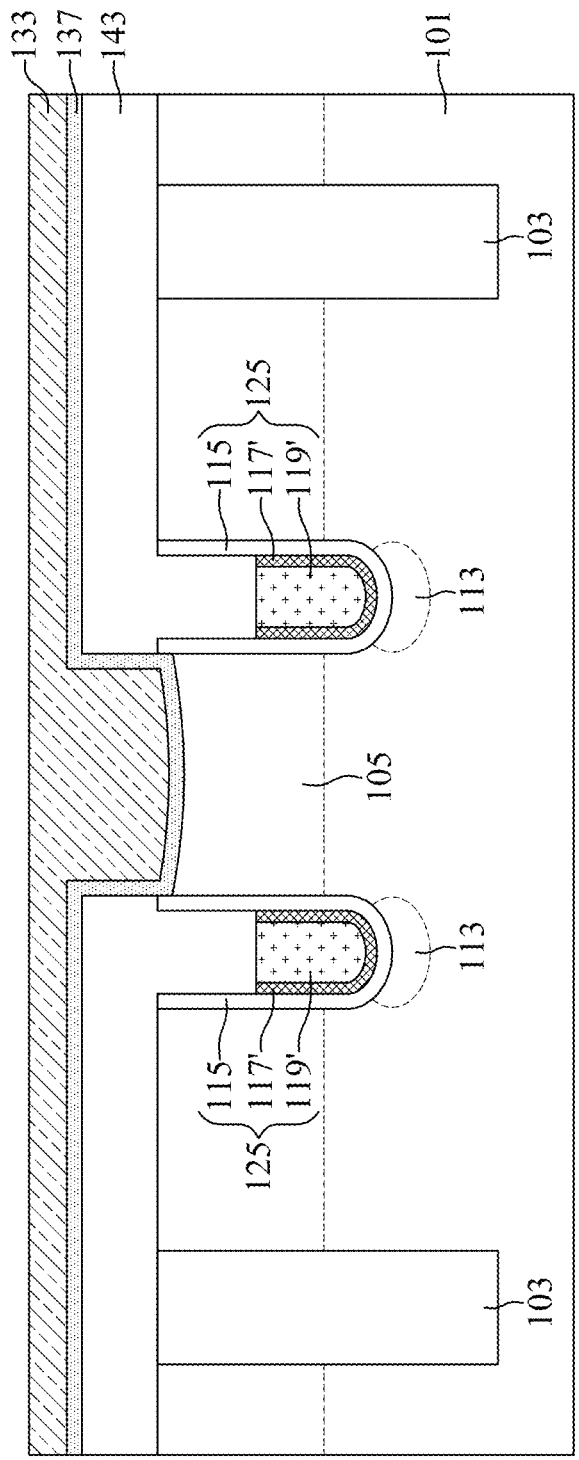
FIG. 17 is a cross-sectional view illustrating an intermediate stage of forming a lower bit line layer during the formation of the semiconductor device, in accordance with some embodiments.

Next, a protection liner 137 and a lower bit line layer 133 are formed over the dielectric cap layer 143, as shown in FIG. 17 in accordance with some embodiments. In some embodiments, the opening 150 (FIG. 16) is filled by the lower bit line layer 133 and the protection liner 137. Moreover, the lower bit line layer 133 may be a single layer including doped polysilicon, metal, metal silicide, or metal compound, or it may be a multi-layer including any combination of the above materials. In addition, the lower bit line layer 133 may be formed by a deposition process, such as a CVD process, a PVD process, an ALD process, a MOCVD process, a sputtering process, or another applicable process.

In some embodiments, the protection liner 137 is in direct contact with an upper portion of the gate dielectric layer 115. In some embodiments, the protection liner 137 is made of a material having a function of improving the adhesion between the lower bit line layer 133 and the S/D region 105 and also a function of suppressing the diffusion of component atoms of the lower bit line layer 133. Examples of the material include tungsten (W), titanium nitride (TiN), titanium (Ti), tantalum (Ta), tungsten-nitride (WN), tungsten silicide nitride (WSiN), titanium silicide nitride (TiSiN), tantalum nitride (TaN) and tantalum silicide nitride (TaSiN). The protection liner 135b can be formed by CVD, PVD, atomic layer deposition (ALD), or any other appropriate method known in the art.

Figure 18:
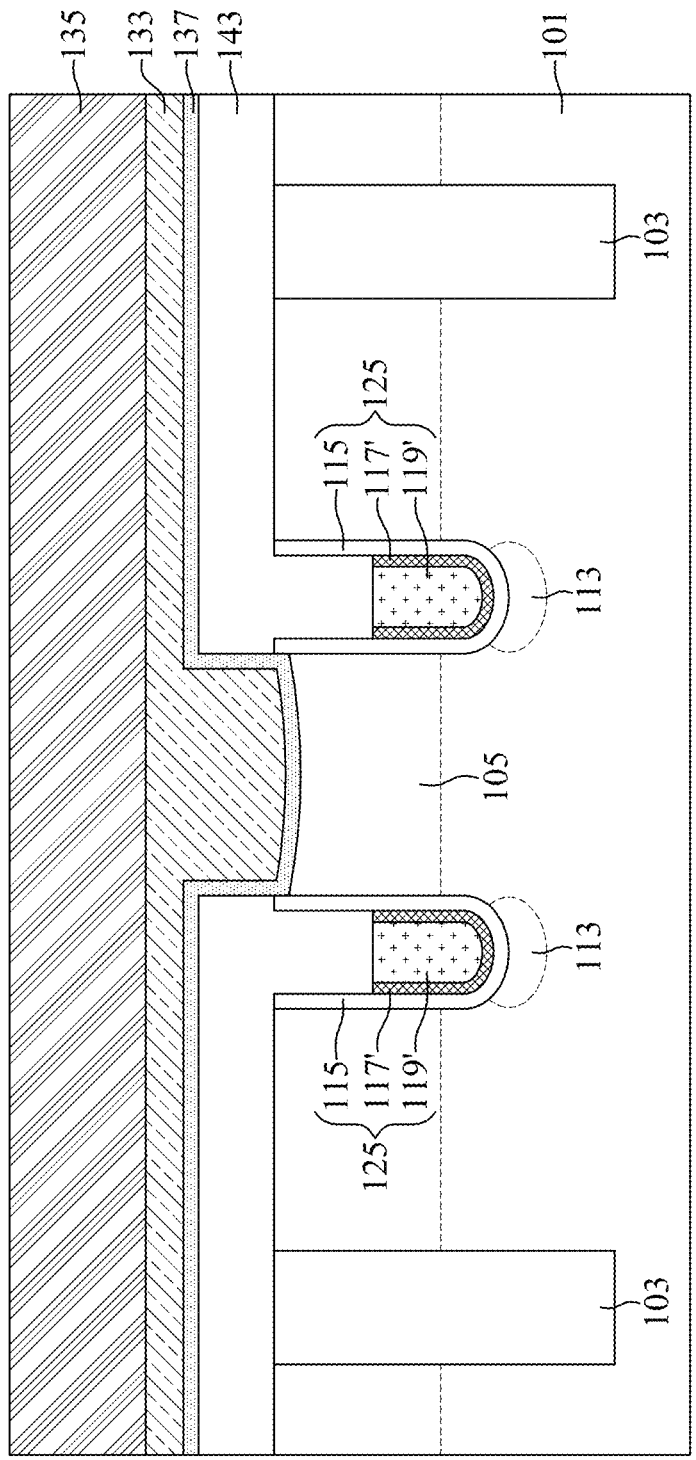
FIG. 18 is a cross-sectional view illustrating an intermediate stage of forming an upper bit line layer during the formation of the semiconductor device, in accordance with some embodiments.

Then, an upper bit line layer 135 is formed over the lower bit line layer 133, as shown in FIG. 18 in accordance with some embodiments. In some embodiments, the upper bit line layer 135 includes multilayers. Moreover, the upper bit line layer 135 may include a metal or a metal compound.

Figure 19:
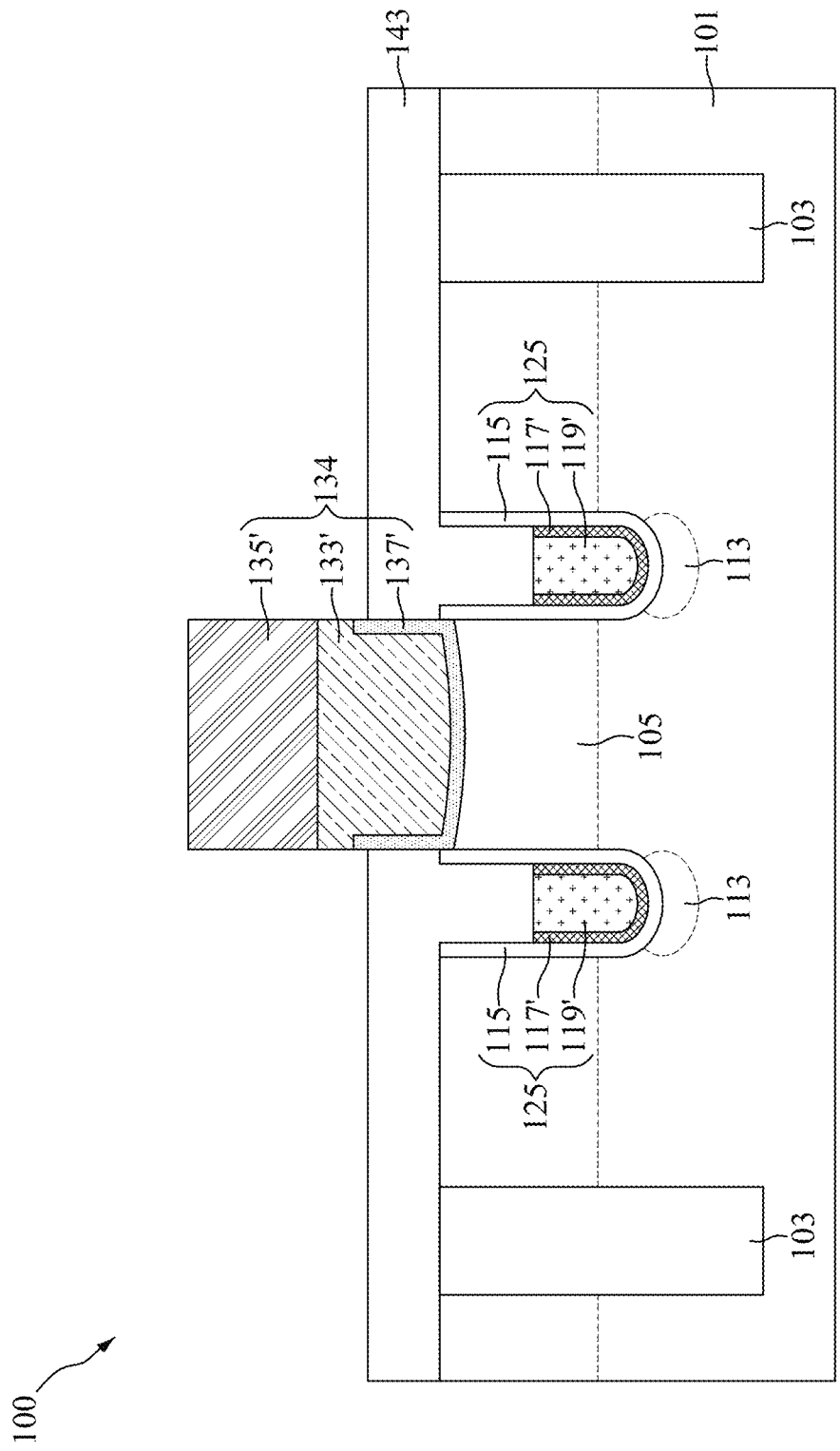
FIG. 19 is a cross-sectional view illustrating an intermediate stage of forming a bit line structure during the formation of the semiconductor device, in accordance with some embodiments.

Subsequently, the upper bit line layer 135 and the lower bit line layer 133 and the protection liner 137 are patterned to form a bit line structure 134. The bit line structure 134 is located over the S/D region 105 between two adjacent gate structures 125, as shown in FIG. 19 in accordance with some embodiments. The respective step is illustrated as the step S29 in the method 10 shown in FIG. 1. In some embodiments, the upper bit line layer 135 and the lower bit line layer 133 are patterned through an etching process. For example, the formation of the bit line structure 134 includes forming a patterned mask (not shown) over the upper bit line layer 135, and etching the upper bit line layer 135 and the lower bit line layer 133 by using the patterned mask as a mask.

The bit line structure 134 includes the remaining portion 135' of the upper bit line layer 135 and the remaining portion 133' of the lower bit line layer 133 and the remaining portion 137' of the protection liner 137'. In some embodiments, the remaining portion 135' of the upper bit line layer 135 and the remaining portion 133' of the lower bit line layer 133 have aligned sidewalls. After the bit line structure 134 is formed, the semiconductor device 100 is obtained. In some embodiments, the semiconductor device 100 is a dynamic random access memory (DRAM), and the gate electrodes 125 are buried word lines (WL).

Figure 20:
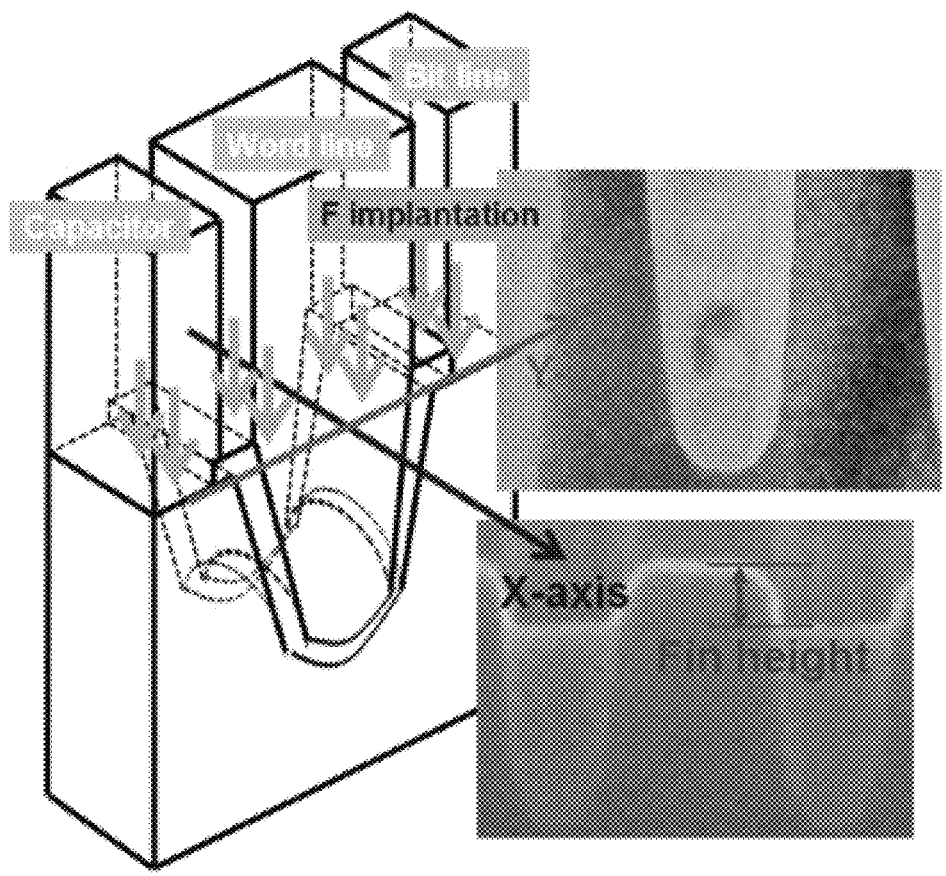
FIG. 20 illustrates a perspective representation and two electron microscope images in accordance with some embodiments.

FIG. 20 illustrates a perspective representation and two electron microscope images in accordance with some embodiments. FIGS. 3 to 19 are cross-sectional views along the Y-axis in FIG. 20. It should be noted that the each of the gate structures 125 (i.e., buried word lines) is formed in the shape of a saddle, as shown in FIG. 20 in accordance with some embodiments.

Embodiments of the method 10 for forming the semiconductor device 100 with buried gate structures 125 are provided in the disclosure. The method includes forming the gate electrode layer 119 in the trenches 110 and over the top surface 101T of the semiconductor substrate 101. In particular, the formation of the gate electrode layer 119 at least includes sequentially performing a first deposition process, a first etching process, and a second deposition process. By performing the first etching process between the first deposition process and the second deposition process, the formation of defects (e.g., overhangs or voids) inside the gate electrode layer 119 can be prevented. Moreover, the thickness of the gate electrode layer 119 over the top surface 101T of the semiconductor substrate 101 can be reduced by performing the first etching process, which results in a lowering of stress. As a result, the overall device performance may be improved.

In one embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes performing a first deposition process, performing a first etching process after the first deposition process, and performing a second deposition process after the first etching process.

In another embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes depositing a first gate electrode material over the gate dielectric layer and the top surface of the semiconductor substrate, and a first gap is surrounded by the first gate electrode material. The formation of the gate electrode layer also includes etching the first gate electrode material to widen the first gap such that a first opening is surrounded by a remaining portion of the first gate electrode material, and a top width of the first opening is greater than a top width of the first gap.

In yet another embodiment of the present disclosure, a method for fabricating a semiconductor device is provided. The method includes forming a trench extending from a top surface of a semiconductor substrate into the semiconductor substrate, and forming a gate dielectric layer lining the trench. The method also includes forming a gate electrode layer in the trench and over the top surface of the semiconductor substrate. The formation of the gate electrode layer includes depositing a first gate electrode material over the gate dielectric layer and the top surface of the semiconductor substrate, and a first gap is surrounded by the first gate electrode material. The formation of the gate electrode layer also includes etching the first gate electrode material to reduce a thickness of the first gate electrode material over the top surface of the semiconductor substrate, and depositing a second gate electrode material over a remaining portion of the first gate electrode material after the first gate electrode material is etched.

The embodiments of the present disclosure have some advantageous features. By performing etching process(es) between the deposition processes, the formation of defects (e.g., overhangs or voids) inside the gate electrode layer can be prevented, and the overall device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    forming a trench extending from a top surface of a semiconductor substrate into the semiconductor substrate, the top surface of the semiconductor substrate comprising a S/D region of the semiconductor substrate;
    forming a gate dielectric layer lining the trench;
    forming a gate electrode layer in the trench and over the top surface of the semiconductor substrate, wherein forming the gate electrode layer comprises:
    performing a first deposition process;
    performing a first etching process after the first deposition process; and
    performing a second deposition process after the first etching process;
    forming a bit line structure over the S/D region of the semiconductor structure, wherein the bit line structure includes a protection liner having a U-shaped profile and in direct contact with an upper portion of the gate dielectric layer.

2. The method for fabricating a semiconductor device of claim 1, wherein a gate electrode material is deposited over the gate dielectric layer and the top surface of the semiconductor substrate during the first deposition process, and a gap is surrounded by the gate electrode material.

3. The method for fabricating a semiconductor device of claim 2, wherein the gap is widened during the first etching process.

4. The method for fabricating a semiconductor device of claim 2, wherein the gate electrode material has a thickness over the top surface of the semiconductor substrate before the first etching process, and the thickness of the gate electrode material is reduced during the first etching process.

5. The method for fabricating a semiconductor device of claim 1, wherein forming the gate electrode layer further comprises:
    performing a second etching process after the second deposition process, wherein the first etching process and the second etching process are dry etching processes; and
    performing a third deposition process after the second etching process.

6. The method for fabricating a semiconductor device of claim 1, further comprising:
    etching the gate electrode layer to form a recess over a remaining portion of the gate electrode layer such that a top surface of the remaining portion of the gate electrode layer is lower than the top surface of the semiconductor substrate; and
    forming a dielectric cap layer to cover the remaining portion of the gate electrode layer and the top surface of the semiconductor substrate.

7. The method for fabricating a semiconductor device of claim 6, further comprising:
    removing a portion of the dielectric capping layer to expose a source/drain (S/D) region adjacent to the remaining portion of the gate electrode layer.

8. A method for fabricating a semiconductor device, comprising:
    forming a trench extending from a top surface of a semiconductor substrate into the semiconductor substrate, the top surface of the semiconductor substrate comprising a S/D region of the semiconductor substrate;
    forming a gate dielectric layer lining the trench;
    forming a gate electrode layer in the trench and over the top surface of the semiconductor substrate, wherein forming the gate electrode layer comprises:
    depositing a first gate electrode material over the gate dielectric layer and the top surface of the semiconductor substrate, wherein a first gap is surrounded by the first gate electrode material; and
    etching the first gate electrode material to widen the first gap such that a first opening is surrounded by a remaining portion of the first gate electrode material, wherein a top width of the first opening is greater than a top width of the first gap; and
    forming a bit line structure over the S/D region of the semiconductor structure, wherein the bit line structure includes a protection liner having a U-shaped profile and in direct contact with an upper portion of the gate dielectric layer.

9. The method for fabricating a semiconductor device of claim 8, further comprising:
    forming a barrier layer over the gate dielectric layer before the gate electrode layer is formed;
    recessing the gate electrode layer and the barrier layer to form a gate structure; and
    forming a dielectric cap layer over the gate structure.

10. The method for fabricating a semiconductor device of claim 8, wherein forming the gate electrode layer further comprises:
    depositing a second gate electrode material over the remaining portion of the first gate electrode material.

11. The method for fabricating a semiconductor device of claim 10, wherein a second gap is surrounded by the second gate electrode material.

12. The method for fabricating a semiconductor device of claim 11, wherein a first distance between a bottommost surface of the first gap and the top surface of the semiconductor substrate is greater than a second distance between a bottommost surface of the second gap and the top surface of the semiconductor substrate.

13. The method for fabricating a semiconductor device of claim 11, wherein forming the gate electrode layer further comprises:
etching the second gate electrode material to widen the second gap such that a second opening is surrounded by a remaining portion of the second gate electrode material, wherein a top width of the second opening is greater than a top width of the second gap.

14. The method for fabricating a semiconductor device of claim 13, wherein forming the gate electrode layer further comprises:
depositing a third gate electrode material over the remaining portion of the second gate electrode material, wherein the first gate electrode material, the second gate electrode material and the third gate electrode material are made of tungsten.

15. A method for fabricating a semiconductor device, comprising:
forming a trench extending from a top surface of a semiconductor substrate into the semiconductor substrate, the top surface of the semiconductor substrate comprising a S/D region of the semiconductor substrate;
forming a gate dielectric layer lining the trench; and
forming a gate electrode layer in the trench and over the top surface of the semiconductor substrate, wherein forming the gate electrode layer comprises:
depositing a first gate electrode material over the gate dielectric layer and the top surface of the semiconductor substrate, wherein a first gap is surrounded by the first gate electrode material;
etching the first gate electrode material to reduce a thickness of the first gate electrode material over the top surface of the semiconductor substrate; and
depositing a second gate electrode material over a remaining portion of the first gate electrode material after the first gate electrode material is etched; and forming a bit line structure over the S/D region of the semiconductor structure, wherein the bit line structure includes a protection liner having a U-shaped profile and in direct contact with an upper portion of the gate dielectric layer.

16. The method for fabricating a semiconductor device of claim 15, wherein the first gap is enlarged during the etching of the first gate electrode material such that a first opening is surrounded by the remaining portion of the first gate electrode material before the second gate electrode material is deposited, and a top width of the first opening is greater than a top width of the first gap.

17. The method for fabricating a semiconductor device of claim 15, wherein forming the gate electrode layer further comprises
etching the second gate electrode material to reduce a thickness of the second gate electrode material over the top surface of the semiconductor substrate.

18. The method for fabricating a semiconductor device of claim 17, wherein a second gap surrounded by the second gate electrode material is enlarged during the etching of the second gate electrode material such that a second opening is surrounded by a remaining portion of the second gate electrode material.

19. The method for fabricating a semiconductor device of claim 15, wherein the first gate electrode material and the second gate electrode material include tungsten, and an etchant used to etch the first gate electrode material includes $N_2$.

20. The method for fabricating a semiconductor device of claim 15, further comprising:
etching the gate electrode layer to form a recess in the trench; and
forming a dielectric cap layer in the recess and over the top surface of the semiconductor substrate such that a portion of the dielectric cap layer is surrounded by the gate dielectric layer.

* * * * *